(12) United States Patent
Zhuo et al.

(10) Patent No.: US 11,760,226 B2
(45) Date of Patent: Sep. 19, 2023

(54) RECHARGEABLE BATTERY MONITORING SYSTEM, BATTERY PACK AND ELECTRIC VEHICLE

(71) Applicant: CONTEMPORARY AMPEREX TECHNOLOGY CO., LIMITED, Ningde (CN)

(72) Inventors: Jianwei Zhuo, Ningde (CN); Zhongliang Guo, Ningde (CN); Guoxiu Wu, Ningde (CN); Qiandeng Li, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 493 days.

(21) Appl. No.: 17/130,768

(22) Filed: Dec. 22, 2020

(65) Prior Publication Data

US 2021/0107377 A1 Apr. 15, 2021

Related U.S. Application Data (63) Continuation of application No. PCT/CN2020/072670, filed on Jan. 17, 2020.

(30) Foreign Application Priority Data

Jan. 21, 2019 (CN) .......................... 201910054833.9

(51) Int. Cl.
*H01M 10/00* (2006.01)
*B60L 58/18* (2019.01)
(Continued)

(52) U.S. Cl.
CPC ............... *B60L 58/18* (2019.02); *B60L 58/12* (2019.02); *G01R 31/3835* (2019.01);
(Continued)

(58) Field of Classification Search
CPC ........ B60L 58/18; B60L 58/12; B60L 3/0046; B60L 3/12; G01R 31/3835;
(Continued)

(56) References Cited

U.S. PATENT DOCUMENTS

2009/0009133 A1  1/2009  Tange et al.
2013/0134942 A1  5/2013  Sakurai et al.
(Continued)

FOREIGN PATENT DOCUMENTS

CN    101262141 A    9/2008
CN    203950030 U    11/2014
(Continued)

OTHER PUBLICATIONS

Machine translation of JP-2005300523-A, obtained Jun. 2023 (Year: 2005).*

(Continued)

*Primary Examiner* — Nicholas P D'Aniello
(74) *Attorney, Agent, or Firm* — Morgan, Lewis & Bockius LLP (57) ABSTRACT

Embodiments of this application disclose a rechargeable battery monitoring system, a battery pack, and an electric vehicle. The rechargeable battery monitoring system includes multiple CMCs, a BMU, and a first bus. Each CMC is connected to the first bus and configured to monitor at least one battery module of a battery pack. The BMU is connected to the first bus and configured to communicate with at least one CMC. The rechargeable battery monitoring system further includes multiple pull-up and/or pull-down modules disposed on a communication path between two adjacent CMCs as part of the first bus. This rechargeable battery monitoring system can stabilize a level on the communication path between the two adjacent CMCs, miti- (Continued)

gate an impact caused by external interference onto communication, and improve communication quality.

13 Claims, 9 Drawing Sheets

(51) Int. Cl.
    *G01R 31/3835* (2019.01)
    *B60L 58/12* (2019.01)
    *H01M 10/42* (2006.01)
    *H01M 10/48* (2006.01)
(52) U.S. Cl.
    CPC ..... *H01M 10/4257* (2013.01); *H01M 10/482* (2013.01); *H01M 2010/4271* (2013.01)
(58) Field of Classification Search
    CPC ........... H01M 10/4257; H01M 10/482; H01M 2010/4271; H01M 2010/4278; H01M 2220/20; H01M 10/425; H01M 10/48; H02J 7/00032; H02J 7/0047; H02J 7/0013; Y02E 60/10; Y02T 10/70; Y02T 90/16
    See application file for complete search history.

(56) References Cited

U.S. PATENT DOCUMENTS

| | | |
|---|---|---|
| 2013/0264881 A1 | 10/2013 | Roeper et al. |
| 2014/0186665 A1* | 7/2014 | Takeyama ............ H01M 50/119 429/61 |

FOREIGN PATENT DOCUMENTS

| | | | |
|---|---|---|---|
| CN | 104737360 A | 6/2015 | |
| CN | 204496490 U | 7/2015 | |
| CN | 204613935 U | 9/2015 | |
| CN | 106899052 A | 6/2017 | |
| CN | 206389350 U | 8/2017 | |
| CN | 207303271 U | 5/2018 | |
| CN | 207691837 U | 8/2018 | |
| EP | 1522865 A1 | 4/2005 | |
| JP | 06152658 A | 5/1994 | |
| JP | 2005300523 A | * 10/2005 | ............ B60L 3/0046 |
| WO | WO2011/135868 A1 | 11/2011 | |

OTHER PUBLICATIONS

Contemporary Amperex Technology Co., Limited, International Search Report and Written Opinion, PCT/CN2020/072670, dated Apr. 15, 2020, 13 pgs.
Contemporary Amperex Technology Co., Limited, Extended European Search Report, EP20745486.9, dated Jul. 13, 2021, 9 pgs.
Ningder Age Man Software Technology Co. Ltd., First Office Action, CN201910054833.9, dated Jul. 22, 2020, 17 pgs.
Ningder Age Man Software Technology Co. Ltd., Second Office Action, CN201910054833.9, dated Oct. 13, 2020, 18 pgs.

* cited by examiner

RECHARGEABLE BATTERY MONITORING SYSTEM, BATTERY PACK AND ELECTRIC VEHICLE

CROSS-REFERENCE TO RELATED APPLICATIONS

This application is a continuation application of PCT Patent Application No. PCT/CN2020/072670, entitled "STORAGE BATTERY MONITORING SYSTEM, BATTERY PACK AND ELECTRIC VEHICLE" filed on Jan. 17, 2020, which claims priority to Chinese Patent Application No. 201910054833.9, filed with the State Intellectual Property Office of the People's Republic of China on Jan. 21, 2019, and entitled "RECHARGEABLE BATTERY MONITORING SYSTEM, BATTERY PACK AND ELECTRIC VEHICLE", all of which are incorporated herein by reference in their entirety.

TECHNICAL FIELD

Embodiments of this application relate to the technical field of battery monitoring, and in particular, to a rechargeable battery monitoring system, a battery pack, and an electric vehicle.

BACKGROUND

Safety of power batteries of an electric vehicle has always been a top concern in the industry. A battery pack of the electric vehicle primarily uses a lithium-ion battery or the like as a rechargeable battery, and a large quantity of battery cells are connected in a serial-parallel manner to form a power battery pack. To ensure driving safety, a cell monitoring circuit (CMC) monitors each cell of the power battery pack and collects operating data of the cell in a driving process. The CMC keeps a communication connection with a battery management unit (BMU) and sends the collected operating data of the battery cell back to the BMU, so that the BMU grasps operating status of the battery cell in real time and takes safety measures when necessary.

However, it is found that at least the following problems exist in the prior art: driving environments differ between vehicles; in a case of a harsh driving environment of a vehicle, severe interference usually occurs to communication between the CMC and the BMU, thereby reducing accuracy and timeliness of transmission of the operating data or even leading to a communication abnormality.

SUMMARY

An objective of embodiments of this application is to provide a rechargeable battery monitoring system, a battery pack, and an electric vehicle, so as to stabilize a level on a communication path of a cell monitoring circuit (CMC), mitigate an impact caused by external interference onto communication, and improve communication quality.

To solve the above technical problem, an embodiment of this application provides a rechargeable battery monitoring system, including: multiple CMCs, a battery management unit (BMU), and a first bus. A rechargeable battery includes multiple electrically-connected battery modules. Each CMC is connected to the first bus and configured to monitor at least one battery module in the rechargeable battery. The BMU is connected to the first bus and configured to communicate with at least one CMC. The rechargeable battery monitoring system further includes multiple pull-up and/or pull-down modules. The pull-up and/or pull-down modules are disposed on a communication path between two adjacent CMCs. The communication path between two adjacent CMCs is also part of the first bus located between the two adjacent CMCs.

An embodiment of this application further provides a battery pack, including a rechargeable battery and the rechargeable battery monitoring system.

An embodiment of this application further provides an electric vehicle, including the battery pack.

The rechargeable battery monitoring system in this embodiment of this application requires that the pull-up and/or pull-down modules are disposed on the communication path between two adjacent CMCs. The communication path between two adjacent CMCs is part of the first bus located between the two adjacent CMCs. By adding the pull-up and/or pull-down modules to the communication path between the two adjacent CMCs, this rechargeable battery monitoring system stabilizes a level on the communication path between the two adjacent CMCs, mitigates an impact caused by external interference onto communication, and improves communication quality.

In addition, the CMCs are connected to the first bus in a daisy chain manner. Among the multiple CMCs, a CMC communicating with the BMU is referred to as a head module. The pull-up and/or pull-down modules are disposed on a communication path between the head module and the BMU. The communication path between the head module and the BMU is part of the first bus located between the head module and the BMU. In this embodiment, a specific connection manner between the CMC and the first bus is provided, and the pull-up and/or pull-down modules are disposed on the communication path between the head module and the BMU. This is conducive to stabilizing the level between the head module and the BMU, mitigating the impact caused by external interference onto communication, and improving communication quality.

In addition, each pull-up and/or pull-down module includes a pull-up circuit and/or a pull-down circuit. When the pull-up and/or pull-down module includes a pull-down circuit, a first end of the pull-down circuit is connected to the communication path, and a second end of the pull-down circuit is connected to a low-potential end of a receiver to which the communication path is directed. When the pull-up and/or pull-down module includes a pull-up circuit, a first end of the pull-up circuit is connected to the communication path, and a second end of the pull-up circuit is configured to receive a preset supply voltage. The supply voltage is higher than a voltage of the low-potential end. When the communication path is a communication path between two adjacent CMCs, the receiver is one of the two adjacent CMCs. When the communication path is a communication path between the head module and the BMU, the receiver is either the head module or the BMU. This embodiment provides a specific connection manner of the pull-up circuit and/or the pull-down circuit.

In addition, the receiver outputs the supply voltage to the second end of the pull-up circuit. In this embodiment, the second end of the pull-up circuit is powered by the supply voltage output by the receiver, so that no additional power supply needs to be configured to power the second end of the pull-up circuit, thereby helping simplify a circuit structure. In addition, in a case of a relatively long communication path, the supply voltage output by the receiver can maximally ensure level stability.

In addition, the communication path further includes a transmit port of a transmitter to which the communication path is directed, and a receive port of a receiver to which the communication path is directed. The transmitter is connected to the first bus through the transmit port, and the receiver is connected to the first bus through the receive port. A specific connection manner of connecting the CMC to the first bus is provided.

In addition, the rechargeable battery monitoring system further includes an isolation unit. The transmit port is connected to the first bus through the isolation unit. Because a potential varies between CMCs and varies between the CMC and the BMU, an isolation unit is configured to implement level isolation between the CMCs and between the CMC and the BMU, and help avoid damage to related devices.

In addition, the BMU includes a communication converter, a microcontroller unit (MCU), and a second bus. The communication converter is connected to the first bus, and is connected to the MCU through the second bus. The communication converter is installed in the BMU, so that the second bus between the communication converter and the MCU is as short as possible to reduce reflection and suppress electromagnetic radiation.

DESCRIPTION OF DRAWINGS

One or more embodiments are described exemplarily with reference to accompanying drawings corresponding to the embodiments. The exemplary description shall not constitute any limitation on the embodiments. Components labeled with the same reference numeral in the accompanying drawings represent similar components. Unless otherwise specified, the accompanying drawings do not constitute any scale limitation.

DESCRIPTION OF EMBODIMENTS

To make the objectives, technical solutions, and advantages of this application clearer, the following describes the embodiments of this application in detail with reference to accompanying drawings. A person of ordinary skill in the art understands that in each embodiment of this application, many technical details are provided to make readers better understand this application. However, the technical solutions claimed in this application can still be implemented even without the technical details and without making variations and modifications based on the following embodiments.

Figure 1:
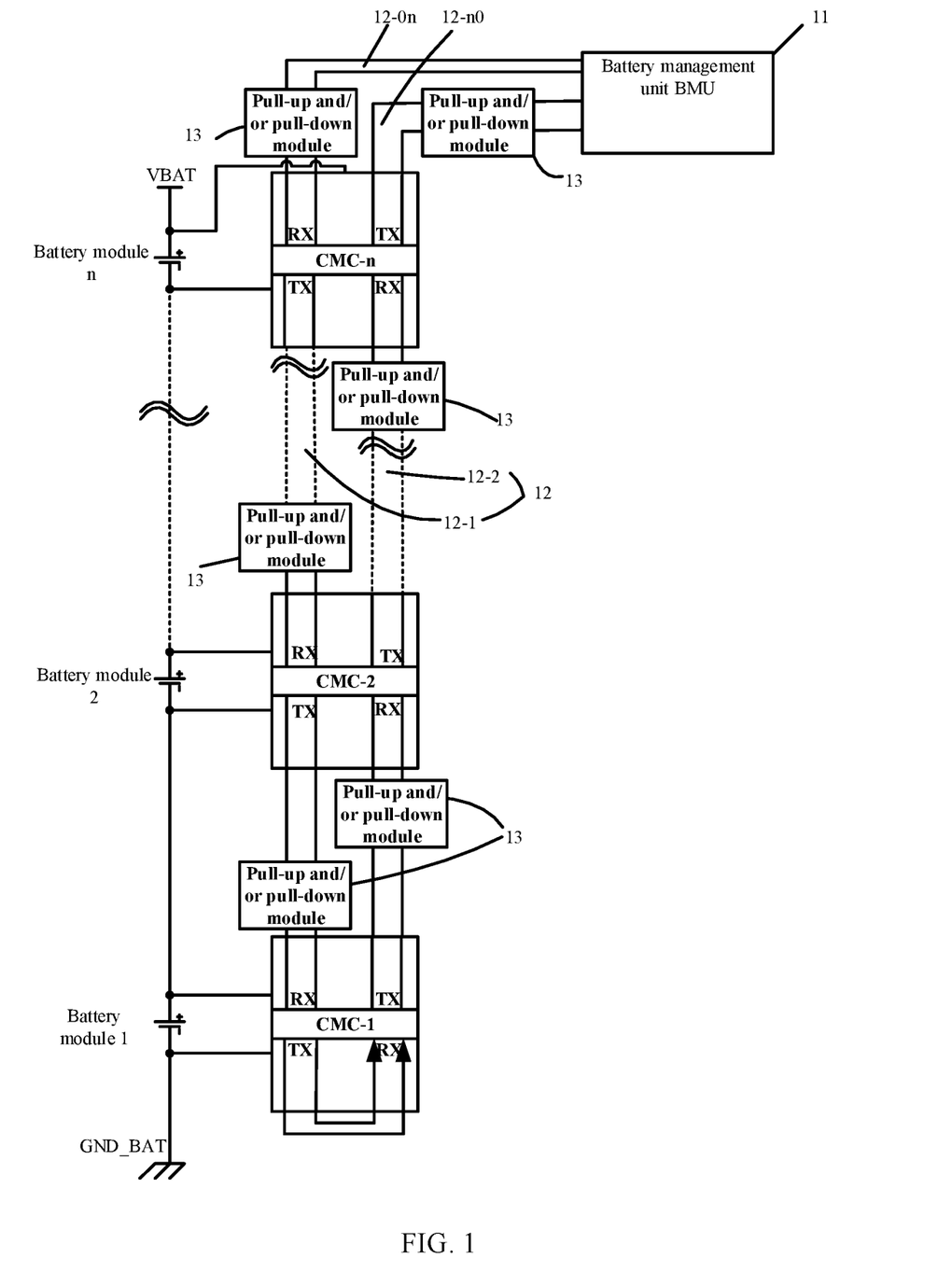
FIG. 1 is a schematic structural diagram of an example of a rechargeable battery monitoring system according to a first embodiment of this application.

A first embodiment of this application relates to a rechargeable battery monitoring system. As shown in FIG. 1, the rechargeable battery monitoring system includes multiple cell monitoring circuits (CMC for short), a battery management unit (BMU for short) 11, and a first bus 12. A rechargeable battery includes multiple electrically-connected battery modules. Each CMC is connected to the first bus 12 and configured to monitor at least one battery module. The BMU 11 is connected to the first bus 12 and configured to communicate with at least one CMC. The rechargeable battery monitoring system further includes multiple pull-up and/or pull-down modules 13. The pull-up and/or pull-down modules 13 are disposed on a communication path between two adjacent CMCs. The communication path between two adjacent CMCs includes the first bus 12 located between the two adjacent CMCs.

As compared with the prior art, in the rechargeable battery monitoring system in the embodiments of this application, the pull-up and/or pull-down modules are disposed on the communication path between two adjacent CMCs. The communication path between two adjacent CMCs is part of the first bus located between the two adjacent CMCs. By adding the pull-up and/or pull-down modules to the communication path between the two adjacent CMCs, this application stabilizes a level on the communication path between the two adjacent CMCs, mitigates an impact caused by external interference onto communication, and improves communication quality.

The following describes details of implementation of the rechargeable battery monitoring system according to this embodiment. The following content of detailed implementation is provided for ease of understanding only, but not necessary for implementing this solution.

In an example shown in FIG. 1, there are n battery modules, denoted by a battery module 1, a battery module 2, a battery module 3, . . . , and a battery module n. The specific value of n may be set according to actual conditions. Each battery module includes one battery cell or a plurality of battery cells connected to each other. In this embodiment, the n battery modules are serial-connected. Potentials of the n serial-connected battery modules increase consecutively. Two cell modules at two ends are a highest-potential cell module and a lowest-potential cell module respectively. As shown in FIG. 1, a low-voltage end of the battery module 1 is grounded, and therefore, the battery module 1 is the lowest-potential cell module, and the battery module n is the highest-potential cell module. However, without being limited thereto, in other examples, if the low-voltage end of the battery module n is grounded, the battery module n is the lowest-potential cell module, and the battery module 1 is the highest-potential cell module. It needs to be noted that the n battery modules may also be parallel-connected, or connected in a hybrid serial-parallel manner.

In this embodiment, the n CMCs are CMC-1, CMC-2, . . . , and CMC-n. The n CMCs are connected to the n battery modules in a one-to-one correspondence. Each CMC is connected to a corresponding battery module, and the n CMCs are in ascending order of voltage. Each CMC is configured to monitor the corresponding battery module, and collect at least one operating parameter of the battery module. The operating parameter of the battery module may be a cell voltage or a temperature of the battery module, or another parameter. It needs to be noted that in other examples, if a CMC includes many sampling channels, the CMC may monitor a plurality of battery modules. For example, if a CMC includes 12 sampling channels and each battery module contains 4 cells, the CMC may monitor 3 battery modules.

In this embodiment, two circumstances may occur. In a first circumstance, the CMC corresponding to the highest-potential cell module among the battery modules communicates with the BMU 11. In a second circumstance, the CMC corresponding to the lowest-potential cell module among the battery modules communicates with the BMU 11.

FIG. 1 is a schematic structural diagram of an example of a rechargeable battery monitoring system, that is, a schematic structural diagram of the rechargeable battery monitoring system under the first circumstance.

In this embodiment, the n CMCs are connected to the first bus 12 in a daisy chain manner, the CMC-n is connected to the BMU 11, and the CMC-1 itself completes a daisy chain loop. The CMC-n connected to the BMU 11 is referred to as a head module, and the CMC-1 is referred to as an end module. The end module CMC-1 itself completes a daisy chain loop. Specifically, a transmit port TX of the CMC 1 is connected to the receive port RX of the CMC 1. The first bus 12 includes two transmission channels. One transmission channel 12-1 transmits signals in a direction from the BMU 11 to each CMC, and is configured to transmit a control signal sent by the BMU 11 to each CMC. The other transmission channel 12-2 transmits signals in a direction from each CMC to the BMU 11, and is configured to upload the operating parameter of the battery module to the BMU 11, where the operating parameter is collected by each CMC. In other words, the signal transmission direction of the transmission channel 12-1 is opposite to the signal transmission direction of the transmission channel 12-2. In an example (in FIG. 1), signals are transmitted between the CMCs and between the CMC and the BMU 11 in a differential manner, that is, both the transmission channel 12-1 and the transmission channel 12-2 adopt differential transmission, thereby helping improve communication quality, robustness, and electromagnetic compatibility performance. In this embodiment, the first bus 12 may be a universal asynchronous receiver/transmitter ("UART" bus for short).

Each pull-up and/or pull-down module 13 is disposed on a communication path between two adjacent CMCs. Specifically, of the two adjacent CMCs, one is a transmitter, and the other is a receiver. The communication path between two adjacent CMCs includes a first bus 12 located between the two adjacent CMCs, a transmit port TX of the transmitter, and a receive port RX of the receiver. The transmitter is connected to the first bus 12 through the transmit port TX, and the receiver is connected to the first bus 12 through the receive port RX. For example, in FIG. 1 and FIG. 2, the CMC-1 and the CMC-2 are two adjacent CMCs, and the communication path between the CMC-1 and the CMC-2 includes two communication subpaths 12-12 and 12-21. Signal transmission directions of the two communication subpaths 12-12 and 12-21 are opposite to each other. In the communication subpath 12-12 (the communication subpath 12-12 is a part of the transmission channel 12-2), the CMC-1 is the transmitter, and the CMC-2 is the receiver. In the communication subpath 12-21 (the communication subpath 12-21 is a part of the transmission channel 12-1), the CMC-2 is the transmitter and the CMC-1 is the receiver. Therefore, for the two adjacent CMCs, identities of the receiver and the transmitter are interchangeable, depending on a direction of the communication path. The direction of the communication path means the signal transmission direction in the communication path. In this embodiment, the pull-up and/or pull-down module 13 is disposed on the first bus 12 between the two adjacent CMCs. The pull-up and/or pull-down module 13 is disposed on both communication subpaths 12-12 and 12-21 of the two adjacent CMCs.

The pull-up and/or pull-down modules are also disposed on the communication path between the head module CMC-n and the BMU 11. Specifically, of the head module CMC-n and the BMU 11, one is a transmitter, and the other is a receiver. The communication path between the head module CMC-n and the BMU 11 is part of the first bus located between the head module CMC-n and the BMU 11, the transmit port TX of the transmitter, and the receive port RX of the receiver. For example, in FIG. 1, the communication path between the CMC-n and the BMU 11 includes two communication subpaths 12-$n$0 and 12-0$n$. Signal transmission directions of the two communication subpaths 12-$n$0 and 12-0$n$ are opposite to each other. In the communication subpath 12-$n$0 (the communication subpath 12-$n$0 is a part of the transmission channel 12-2), the CMC-$n$ is the transmitter, and the BMU 11 is the receiver. In the communication subpath 12-0$n$ (the communication subpath 12-0$n$ is a part of the transmission channel 12-1), the BMU 11 is the transmitter and the CMC-n is the receiver. Therefore, for the CMC-n and the BMU 11, the identities of the receiver and the transmitter are interchangeable, depending on the direction of the communication path. The direction of the communication path means the signal transmission direction in the communication path. In this example, the pull-up and/or pull-down module 13 is disposed on the first bus 12 between the CMC-n and the BMU 11. The pull-up and/or pull-down module 13 is disposed on both communication subpaths 12-$n$0 and 12-0$n$ of the CMC-n and the BMU 11.

Figure 2:
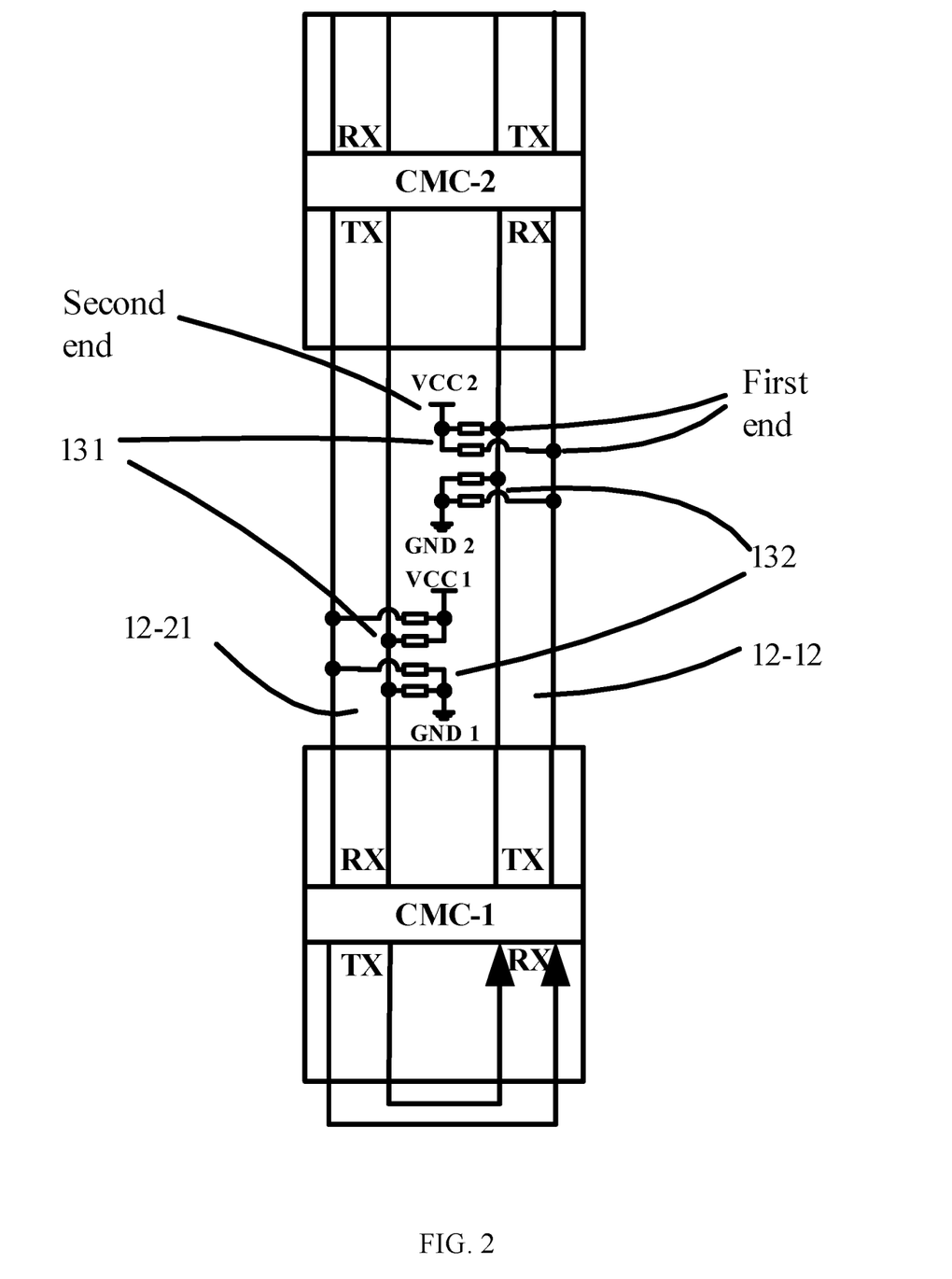
FIG. 2 is a detailed schematic structural diagram of a pull-up and/or pull-down module according to a first embodiment of this application.

In this embodiment, the pull-up and/or pull-down module 13 includes a pull-up circuit and/or a pull-down circuit. In this embodiment, using the pull-up and/or pull-down module 13 between the CMC-1 and the CMC-2 as an example, as shown in FIG. 2, the pull-up circuit is specifically a pull-up resistor circuit 131, and the pull-down circuit is specifically a pull-down resistor circuit 132. It needs to be noted that because a differential transmission manner is adopted in this embodiment, the transmission channel 12-1 and the transmission channel 12-2 each include two transmission lines (to transmit differential signals). Therefore, the pull-up resistor circuit 131 includes two resistors, and the two resistors are connected to the two transmission lines respectively in a one-to-one correspondence. The pull-down resistor circuit 132 also includes two resistors, and the two resistors are connected to the two transmission lines respectively in a one-to-one correspondence. In other examples, the transmission channel 12-1 and the transmission channel 12-2 may each include one transmission line (without adopting a differential transmission manner), and therefore, the pull-up resistor circuit 131 and the pull-down resistor circuit 132 may each include a resistor.

In practical applications, in setting a resistance value of the resistor in the pull-up resistor circuit 131, both power consumption of the pull-up resistor circuit 131 and a sufficient driving capability of the pull-up resistor circuit 131 need to be considered. If the resistance value of the resistor in the pull-up resistor circuit 131 is too large, a communication waveform on the communication path is likely to distort. In addition, the resistance value of the resistor in the pull-down resistor circuit 132 is advisably not in the same order of magnitude as the resistance value of the resistor in the pull-up resistor circuit 131. In some embodiments, the resistance value of the resistor in the pull-down resistor circuit 132 is 11 times larger than that of the resistor in the pull-up resistor circuit 131, so as to prevent a voltage in the pull-down resistor circuit 132 from being divided to a relatively low value. In addition, considering power consumption, the resistance value of the resistor in the pull-down resistor circuit 132 is advisably not too small. In this embodiment, the resistor in the pull-up resistor circuit 131 may be a resistor of 1-10K Ohm, and the resistor in the pull-down resistor circuit 132 may be a resistor of 50 K Ohm or more.

Specifically, a first end of the pull-up resistor circuit 131 is connected to the communication path. In other words, the first end of the pull-up resistor circuit 131 in this embodiment is connected to the first bus between two adjacent CMCs, or to the first bus between the head module CMC-n and the BMU 11. A second end of the pull-up resistor circuit 131 is connected to a preset power supply terminal of the pull-up resistor circuit. A first end of the pull-down resistor circuit 132 is connected to the communication path. In other words, the first end of the pull-down resistor circuit 132 in this embodiment is connected to the first bus between two adjacent CMCs, or to the first bus between the head module CMC-n and the BMU 11. A second end of the pull-down resistor circuit 132 is connected to a low-potential end of the receiver to which the communication path is directed. A potential of the power supply terminal of the pull-up resistor circuit is higher than that of the low-potential end of the receiver.

When the receiver is a CMC, because each CMC is connected to the low-potential end and the high-potential end of a corresponding battery module, the low-potential end and the high-potential end of the receiver are the low-potential end and the high-potential end of the battery module corresponding to the CMC respectively. For example, in FIG. 1, when the CMC-2 serves as the receiver, the low-potential end of the CMC-2 is the low-potential end of the battery module 2. Because the high-potential end of the CMC-1 and the low-potential end of the CMC-2 are equipotential, and the high-potential end of the CMC-1 is the high-potential end of the battery module 1. Therefore, the low-potential end of the CMC-2 is also the high-potential end of the battery module 1. When the receiver is the BMU 11, the low-potential end of the BMU 11 is the high-potential end of the CMC-n, and is also the high-potential end of the battery module n corresponding to the CMC-n. It needs to be noted a reference numeral GND1 in FIG. 2 denotes the low-potential end of the CMC-1, and a reference numeral GND2 denotes the low-potential end of the CMC-2. A reference number GND BAT in FIG. 1 denotes a system ground. Because GND BAT is the low-potential end of the battery module 1, the low-potential end GND1 of the CMC-1 in FIG. 2 and the low-potential end GND BAT of the battery module 1 are equipotential.

In this embodiment, the receiver outputs the supply voltage to the second end of the pull-up circuit. Referring to FIG. 2, on the communication subpath 12-12, the CMC-2 serves as the receiver, and the second end of the pull-up circuit at the receive port of the CMC-2 receives the supply voltage output by the CMC-2. In other words, each CMC provides a supply voltage for the pull-up circuit at the receive port thereof. Specifically, the second end of the pull-up circuit may also be powered by the battery module in the rechargeable battery in this embodiment. Generally, a CMC includes one or more cell sampling chips. The cell sampling chip is powered by the battery module monitored by the cell sampling chip. The cell sampling chip in the CMC steps down a voltage obtained by the battery module monitored by the cell sampling chip, and outputs a stable voltage available to the CMC. The output stable voltage may be used for communication and other purposes. In this embodiment, the second end of the pull-up circuit is powered by the supply voltage output by the receiver (the supply voltage output by the receiver is a stable voltage used by the CMC), so that no additional power supply needs to be configured to power the second end of the pull-up circuit, thereby helping simplify a circuit structure. The supply voltage output by the receiver may be, but is not limited to, 5 V or 3.3 V.

It needs to be noted that the pull-up and/or pull-down module 13 may include either a pull-up module or a pull-down module, or a combination thereof. The pull-up and/or pull-down module in the example in FIG. 1 and FIG. 2 includes a pull-up module and a pull-down module. However, in other examples, only a pull-up module is disposed on the communication path, or only a pull-down module is disposed on the communication path, depending on design performed according to actual needs.

The pull-up module can not only stabilize a level on the communication path between two adjacent CMCs and on the communication path between the CMC and the BMU 11, mitigate external interference, but also provide a sufficient driving capability when the first bus is relatively long. The pull-down module can not only provide a discharge channel for high-frequency interference and serve a function of filtering, but also suppress damage caused by electrostatic discharge ("ESD" for short) and provide a discharge path. This stabilizes the level on the communication path between two adjacent CMCs and on the communication path between the CMC and the BMU 11, mitigates an effect caused by external interference onto communication, and improves communication quality.

Described above is an exemplary rechargeable battery monitoring system in the first circumstance, in which the CMC corresponding to the highest-potential cell module in the battery module communicates with the BMU 11.

Design conception is the same between a schematic circuit diagram under the second circumstance and a schematic circuit diagram under the first circumstance. The following describes only differences from the first circumstance.

Figure 3:
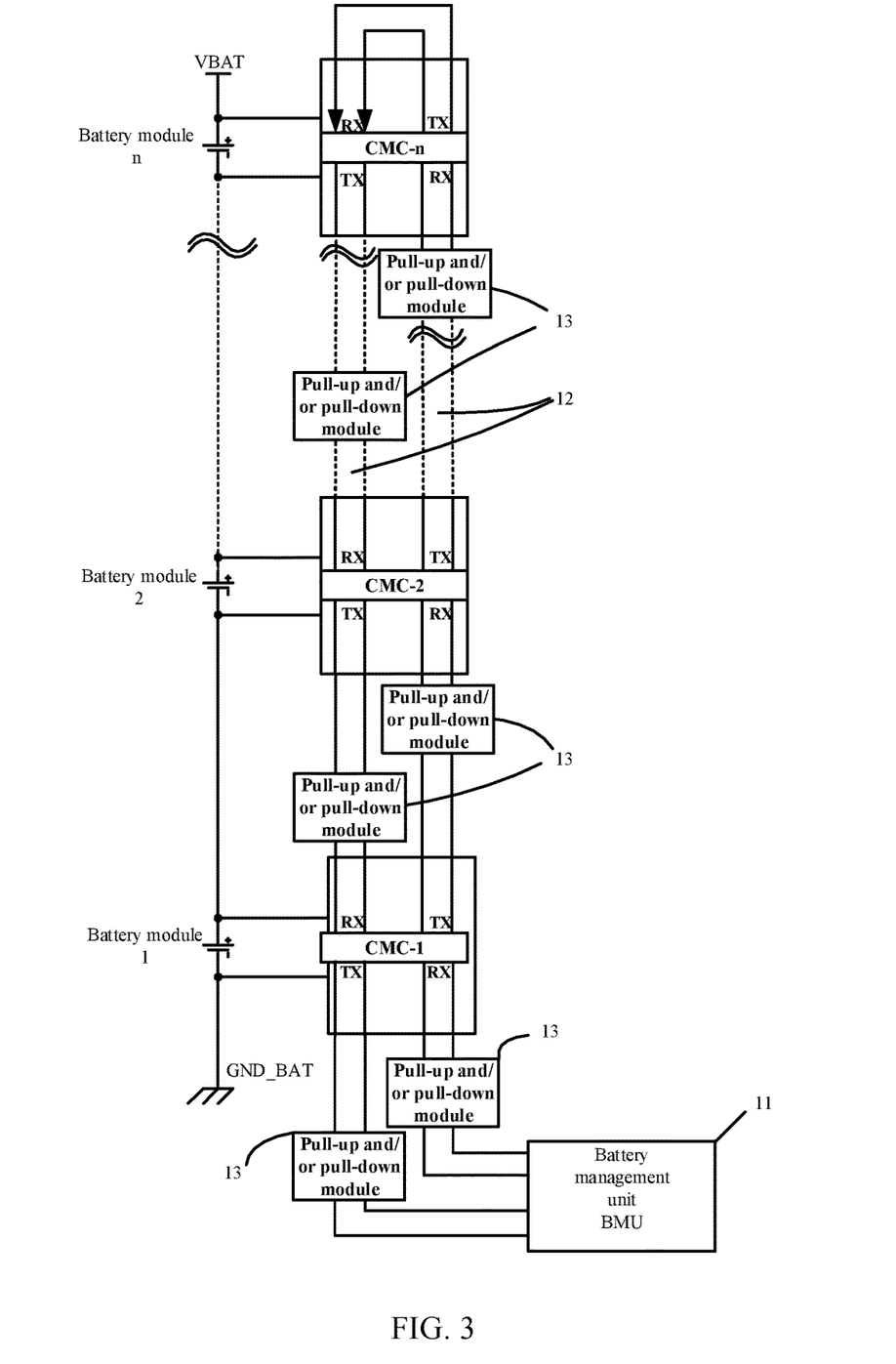
FIG. 3 is a schematic structural diagram of another example of a rechargeable battery monitoring system according to a first embodiment of this application.

Referring to FIG. 3, FIG. 3 is a schematic structural diagram of another example of a rechargeable battery monitoring system according to this embodiment.

The example in FIG. 3 differs from the example in FIG. 1 in that, in the example in FIG. 3, the CMC-1 is connected to the BMU 11, and the CMC-n itself completes a daisy chain loop, in which the head module is the CMC-1 and the end module is the CMC-n. Other connection manners and signal transmission manners of the rechargeable battery monitoring system in FIG. 3 are similar to the example in FIG. 1, and not described here anymore.

A second embodiment of this application relates to a rechargeable battery monitoring system. The second embodiment is roughly the same as the first embodiment, but differs in that: in the first embodiment, the pull-up and/or pull-down module is connected to the first bus; but in the second embodiment, the pull-up and/or pull-down module may be integrated in the receiver and connected to the receive port RX.

In this embodiment, two circumstances may still occur. In a first circumstance, the CMC corresponding to the highest-potential cell module among the battery modules communicates with the BMU 11. In a second circumstance, the CMC corresponding to the lowest-potential cell module among the battery modules communicates with the BMU 11.

Figure 4:
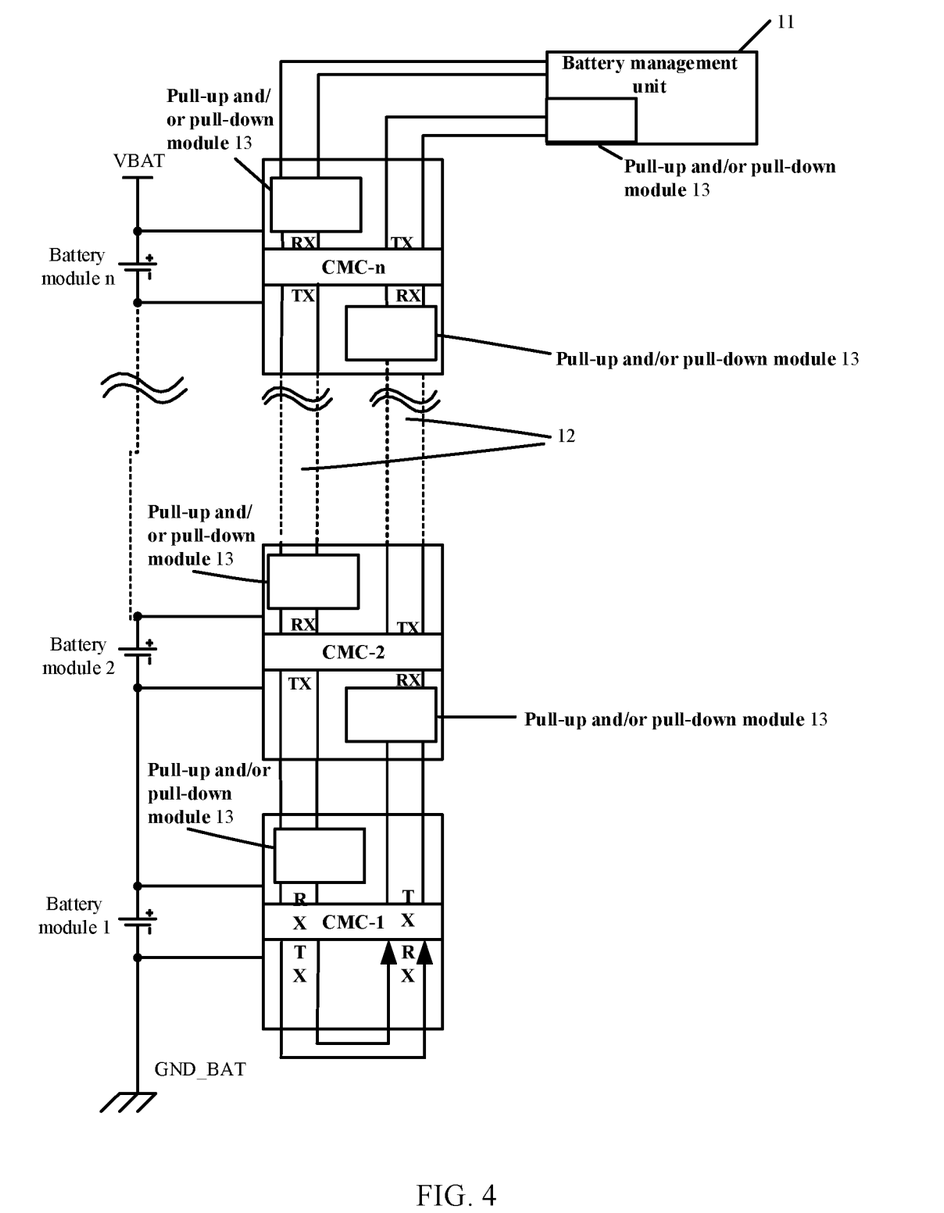
FIG. 4 is a schematic structural diagram of an example of a rechargeable battery monitoring system according to a second embodiment of this application.

FIG. 4 is a schematic structural diagram of an example of a rechargeable battery monitoring system according to the second embodiment, that is, a schematic structural diagram of the rechargeable battery monitoring system under the first circumstance.

Circuit connection in FIG. 4 is similar to that in FIG. 1, but differs in that the pull-up and/or pull-down module is integrated in the receiver and connected to the receive port RX, description of which is omitted here.

Figure 5:
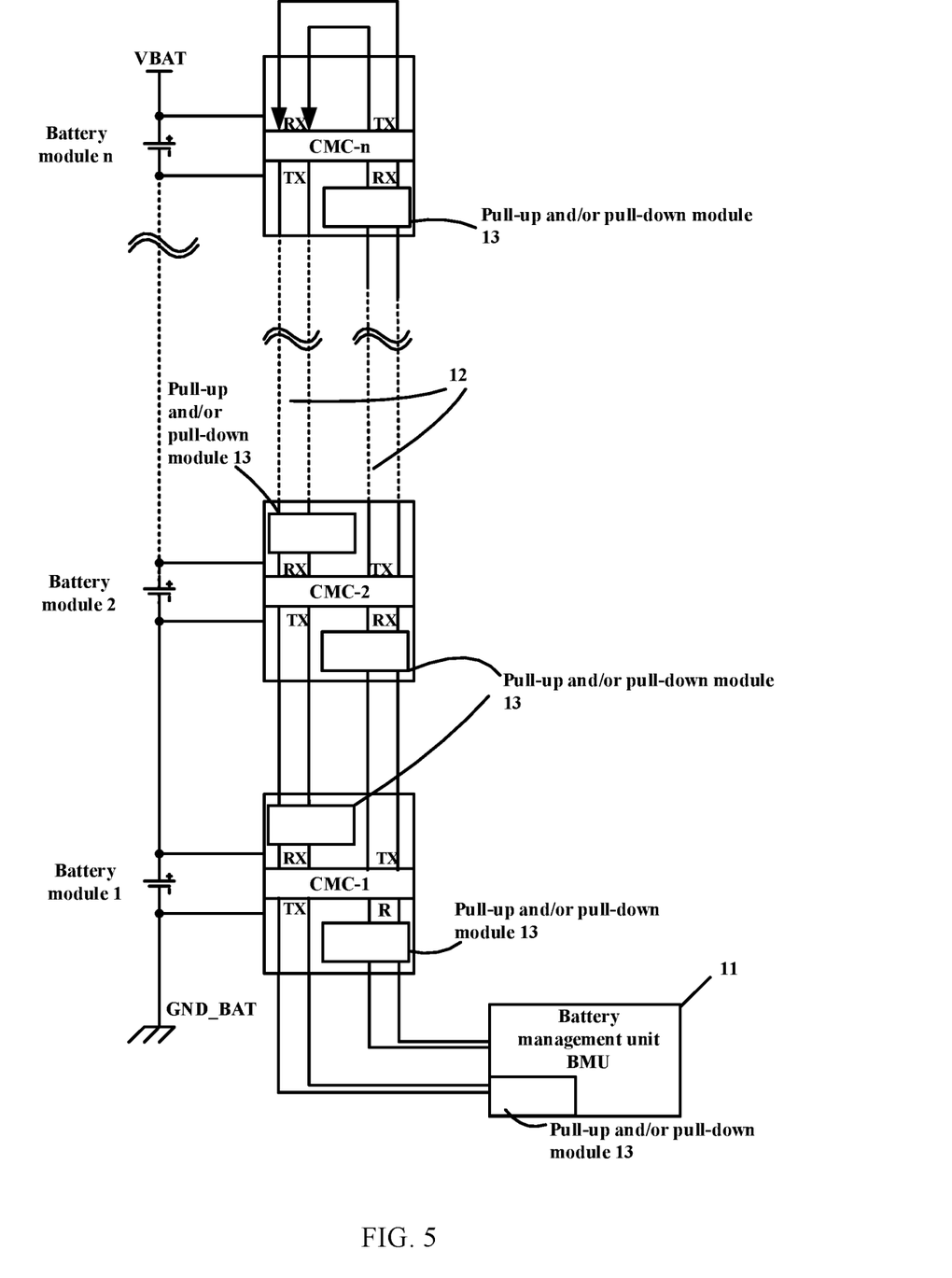
FIG. 5 is a schematic structural diagram of another example of a rechargeable battery monitoring system according to a second embodiment of this application.

FIG. 5 is a schematic structural diagram of another example of a rechargeable battery monitoring system according to the second embodiment, that is, a schematic structural diagram of the rechargeable battery monitoring system under the second circumstance.

Circuit connection in FIG. 5 is similar to that in FIG. 3, but differs in that the pull-up and/or pull-down module is integrated in the receiver and connected to the receive port RX, description of which is omitted here.

A third embodiment of this application relates to a rechargeable battery monitoring system. The third embodiment is roughly the same as the first embodiment, and makes the following main improvements: in the third embodiment of this application, the BMU includes a communication converter, a microcontroller unit (MCU), and a second bus. The communication converter is connected to the first bus, and is connected to the MCU through the second bus.

Figure 6:
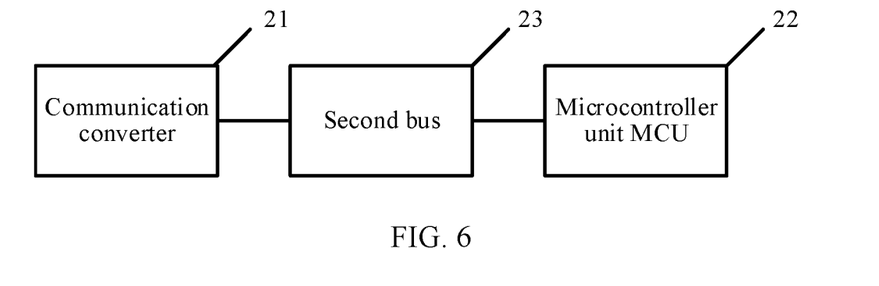
FIG. 6 is a schematic block diagram of a battery management unit (BMU) in a rechargeable battery monitoring system according to a third embodiment of this application.

FIG. 6 is a schematic block diagram of a battery management unit (BMU) in a rechargeable battery monitoring system according to this embodiment.

Figure 7:
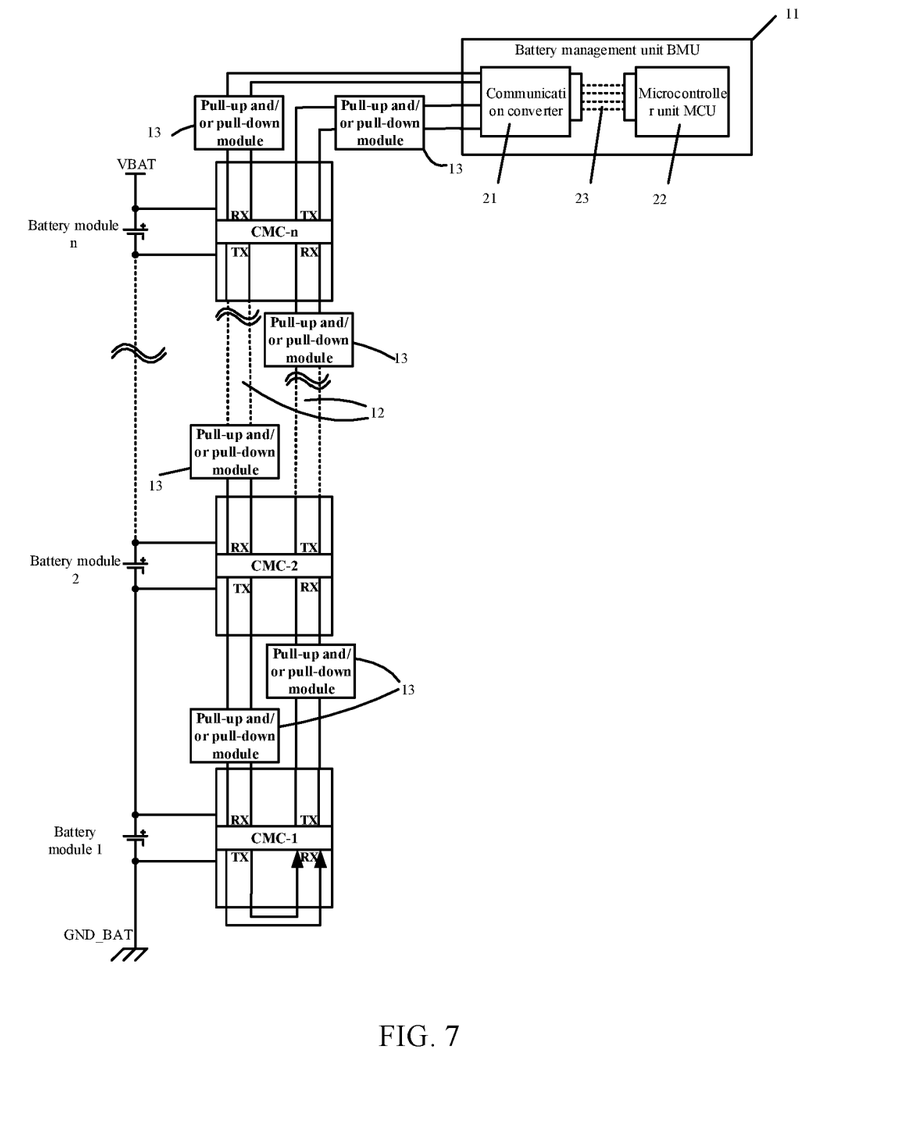
FIG. 7 is a schematic structural diagram of an example of a rechargeable battery monitoring system according to a third embodiment of this application.

Referring to FIG. 7, FIG. 7 is a schematic structural diagram of an example of a rechargeable battery monitoring system according to this embodiment. In FIG. 7, the CMC corresponding to the highest-potential cell module in the battery module communicates with the BMU 11. The circuit connection is similar to that in FIG. 1, and differs only in that specific connection relationships between the communication converter 21, the MCU 22, and the second bus 23 included in the BMU are further provided, description of which is omitted here.

Figure 8:
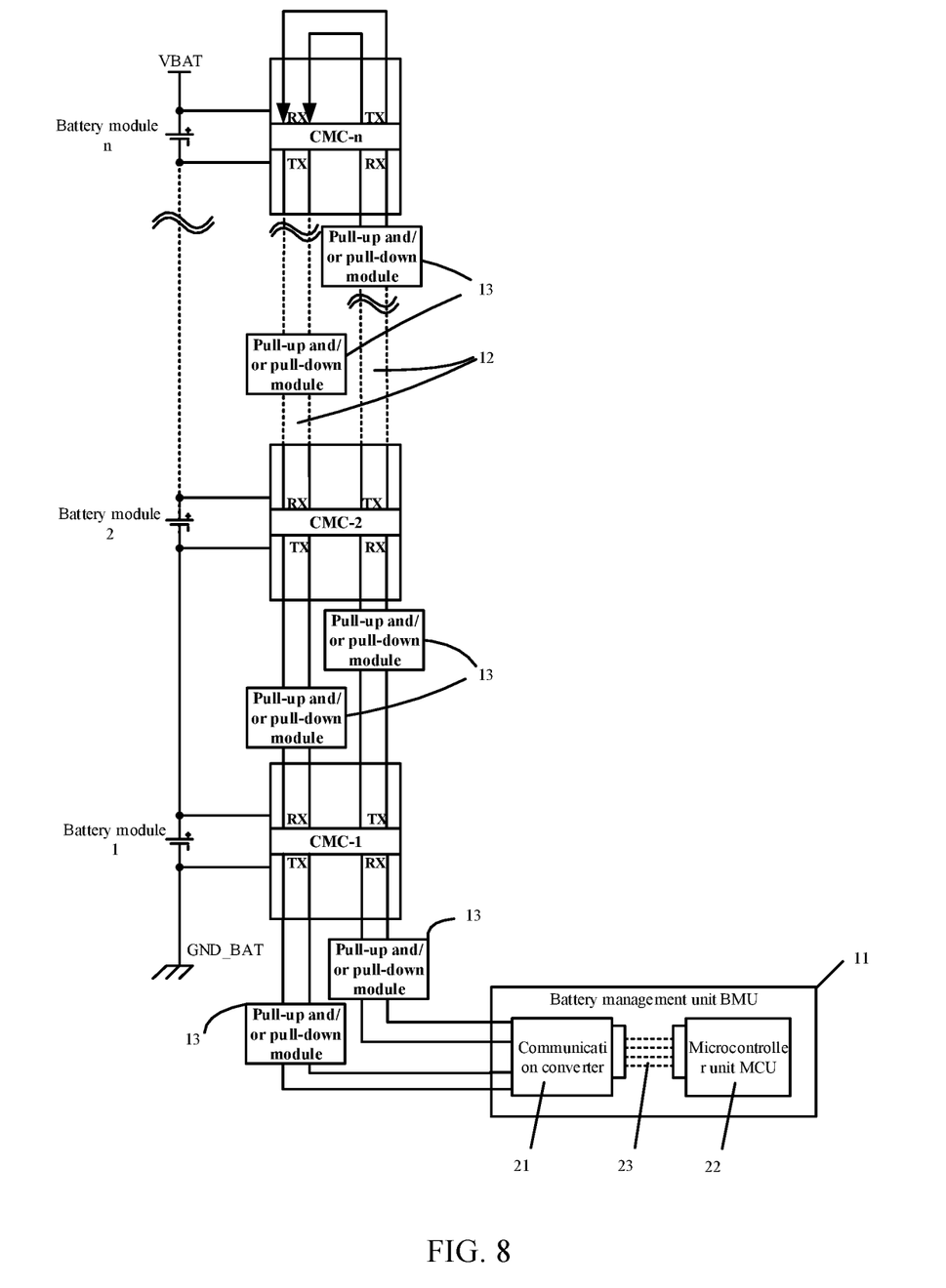
FIG. 8 is a schematic structural diagram of another example of a rechargeable battery monitoring system according to a third embodiment of this application.

Referring to FIG. 8. FIG. 8 is a schematic structural diagram of another example of a rechargeable battery monitoring system according to this embodiment. In FIG. 8, the CMC corresponding to the lowest-potential cell module in the battery module communicates with the BMU 11. The circuit connection is similar to that in FIG. 3, and differs only in that specific connection relationships between the communication converter 21, the MCU 22, and the second bus 23 included in the BMU are further provided, description of which is omitted here.

In this embodiment, the second bus 23 may be one of a serial peripheral interface ("SPI" for short) bus, a UART bus, a controller area network ("CAN" for short) bus, or an inter integrated circuit ("I²C" for short) bus. Nonetheless, another type of bus may also serve as the second bus 23, and the type of bus is not limited in this embodiment.

The communication converter 21 is configured to convert, by using the second bus 23, data transmitted by the head module into a communication protocol supported by the MCU 22. In this embodiment, the communication converter 21 is installed in the BMU 11, so that the second bus 23 between the communication converter 21 and the MCU 22 is as short as possible to reduce reflection and suppress electromagnetic radiation.

It needs to be noted that the third embodiment may also be an improvement made on the basis of the second embodiment.

A fourth embodiment of this application relates to a rechargeable battery monitoring system. The fourth embodiment is a further improvement made on the basis of the third embodiment. Specific improvements are: in this embodiment, the rechargeable battery monitoring system further includes an isolation unit 31, and the transmit port TX is connected to the first bus through the isolation unit 31.

Figure 9:
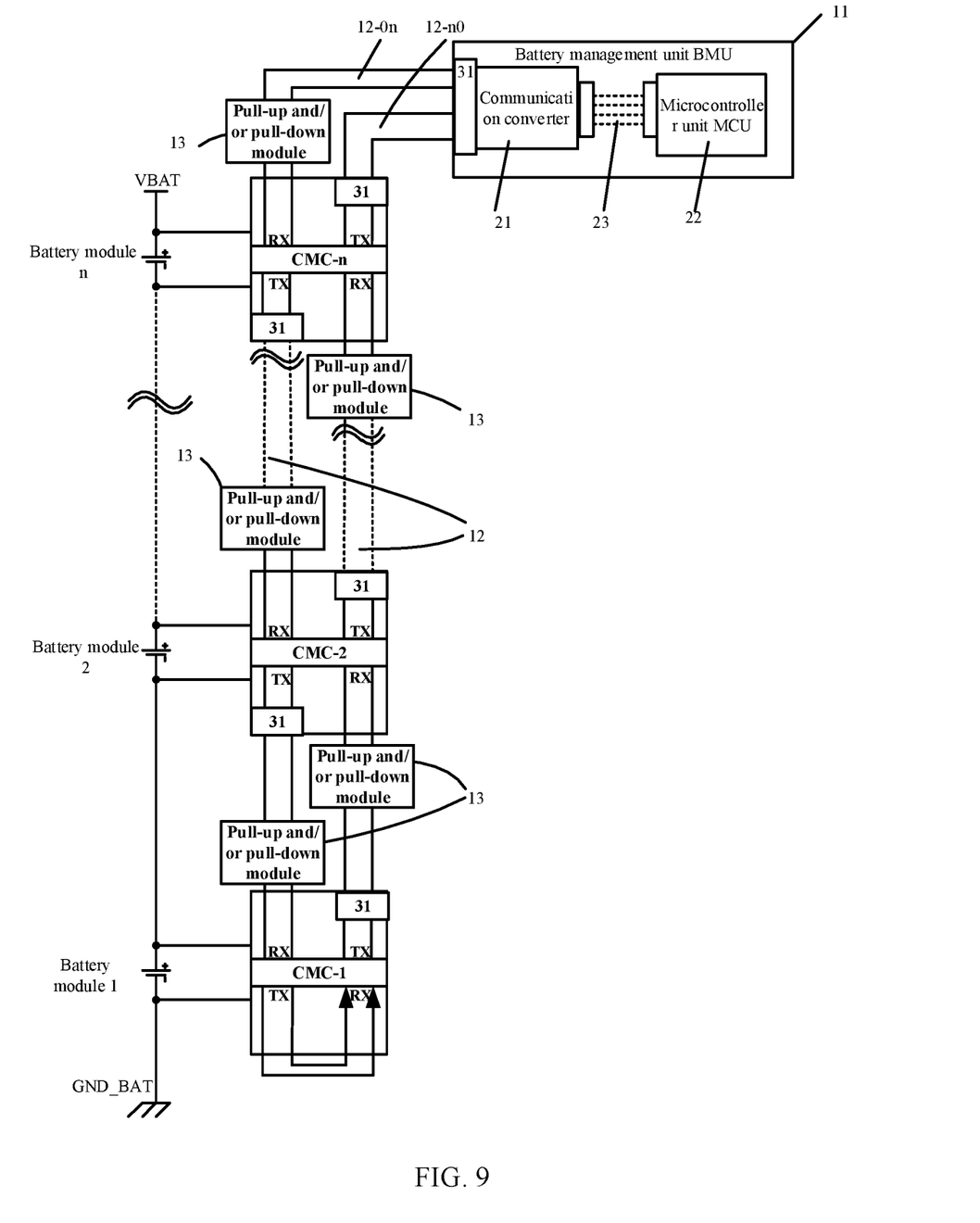
FIG. 9 is a schematic structural diagram of a rechargeable battery monitoring system according to a fourth embodiment of this application.

FIG. 9 is a schematic structural diagram of a rechargeable battery monitoring system according to this embodiment. The isolation unit 31 is disposed between two adjacent CMCs and disposed between the CMC and the BMU. The isolation unit 31 is integrated in the transmitter. In this embodiment, the isolation unit is configured to implement level isolation between the CMCs and between the CMC and the BMU, and help avoid damage to related devices. The isolation unit 31 may be one of a capacitive isolation unit 31, an inductive isolation unit 31, or an optical isolation unit 31.

It needs to be noted that in FIG. 9, the pull-up and/or pull-down module is omitted on the communication subpath 12-n0 between the CMC-n and the BMU 11. Main reasons are: the transmit port TX of the CMC-n is connected to the first bus 12 through the isolation unit 31 integrated in the CMC-n, and the receive port RX of the BMU 11 is connected to the first bus 12 through the isolation unit 31 integrated in the BMU 11. Specifically, the isolation unit 31 is disposed at both ends of the communication subpath 12-n0. Therefore, for the communication subpath 12-n0, level isolation is performed at both ends of the communication subpath by using the isolation unit 31. Anti-interference capabilities on the communication subpath 12-n0 are already high. In this case, the pull-up and/or pull-down module may be omitted in the communication subpath 12-n0.

In addition, the fourth embodiment may also be an improvement made on the basis of the first or second embodiment.

Figure 10:
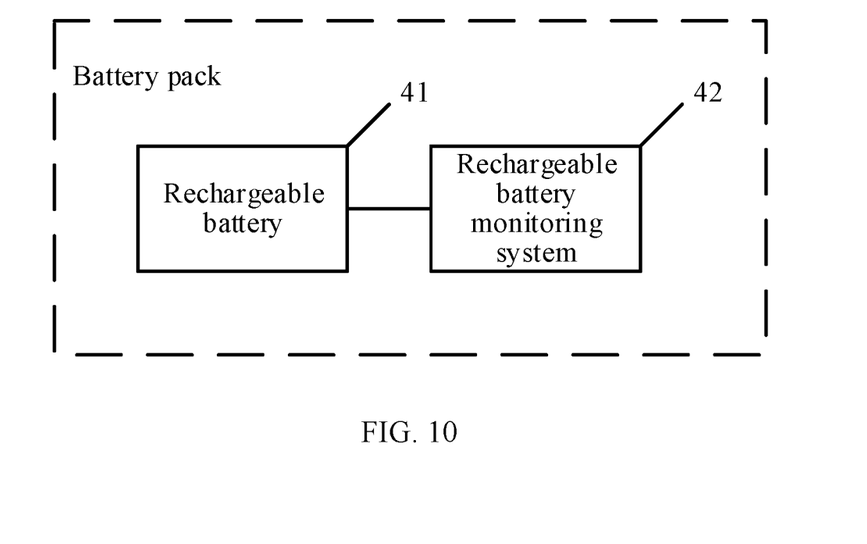
FIG. 10 is a schematic block diagram of a battery pack according to a fifth embodiment of this application.

A fifth embodiment of this application relates to a battery pack. Referring to FIG. 10, the battery pack includes a rechargeable battery 41 and the rechargeable battery monitoring system 42 described in any of the first to fourth embodiments.

Apparently, this embodiment is a system embodiment corresponding to any of the first to fourth embodiments, and this embodiment may be implemented in collaboration with any of the first to fourth embodiments. Relevant technical details mentioned in the first to fourth embodiments are still applicable to this embodiment. For brevity, details are omitted here. Correspondingly, relevant technical details mentioned in this embodiment are also applicable to any of the first to fourth embodiments.

A sixth embodiment of this application relates to an electric vehicle, including the battery pack according to the fifth embodiment.

Apparently, this embodiment is a system embodiment corresponding to the fifth embodiment, and this embodiment may be implemented in collaboration with the fifth embodiment. Relevant technical details mentioned in the fifth embodiment are still applicable to this embodiment. For brevity, details are omitted here. Correspondingly, relevant technical details mentioned in this embodiment are also applicable to the fifth embodiment.

It needs to be noted that all modules referred to in this embodiment are logical modules. In practical applications, a logical unit may be a physical unit or a part of a physical unit, or a combination of a plurality of physical units. In addition, to highlight an innovation part of this application, this embodiment does not describe units that are not closely related to solving the technical issues put forward in this application, which, however, shall not mean that no other units exist in this embodiment.

A person of ordinary skill in the art understands that the embodiments described above are exemplary embodiments for implementing this application. In practical applications, various modifications may be made in form and detail to the embodiments without departing from the spirit and scope of this application.

What is claimed is:

1. A rechargeable battery monitoring system, comprising several cell monitoring circuits, CMCs, a battery management unit, BMU, and a first bus, wherein a rechargeable battery comprises several electrically connected battery modules, each CMC is connected to the first bus and configured to monitor at least one battery module; the BMU is connected to the first bus and configured to communicate with at least one CMC, wherein, among the several CMCs, a CMC communicating with the BMU is referred to as a head module; the rechargeable battery monitoring system further comprises several pull-up and pull-down modules; and the pull-up and pull-down modules are disposed on a communication path between two adjacent CMCs, and the communication path between two adjacent CMCs comprises the first bus located between the two adjacent CMCs;

wherein the pull-up module comprises a pull-up circuit and the pull-down module comprises a pull-down circuit;

the pull-up circuit is a pull-up resistor circuit and the pull-down circuit is a pull-down resistor circuit, wherein:

the resistance value of the resistor in the pull-up resistor circuit, is set considering both power consumption of the pull-up resistor circuit and driving capability of the pull-up resistor circuit;

the resistance value of the resistor in the pull-down resistor circuit is not in the same order of magnitude as the resistance value of the resistor in the pull-up resistor circuit, and the resistance value of the resistor in the pull-down resistor circuit is larger than the resistance value of the resistor in the pull-up resistor circuit;

a first end of the pull-down circuit is connected to the communication path, and a second end of the pull-down circuit is connected to a low-potential end of a receiver to which the communication path is directed;

a first end of the pull-up circuit is connected to the communication path, and a second end of the pull-up circuit is configured to receive a preset supply voltage, and the supply voltage is higher than a voltage of the low-potential end; and in a case that the communication path is a communication path between two adjacent CMCs, the receiver is one of the two adjacent CMCs, and, in a case that the communication path is a communication path between the head module and the BMU, the receiver is either the head module or the BMU.

2. The rechargeable battery monitoring system according to claim 1, wherein the CMCs are connected to the first bus in a daisy chain manner; and the pull-up and pull-down modules are disposed on a communication path between the head module and the BMU, and the communication path between the head module and the BMU comprises the first bus located between the head module and the BMU.

3. The rechargeable battery monitoring system according to claim 1, wherein the receiver is configured to output the supply voltage to the second end of the pull-up circuit.

4. The rechargeable battery monitoring system according to claim 1, wherein the communication path further comprises a transmit port of a transmitter to which the communication path is directed, and a receive port of a receiver to which the communication path is directed; the transmitter is connected to the first bus through the transmit port, and the receiver is connected to the first bus through the receive port.

5. The rechargeable battery monitoring system according to claim 4, wherein the pull-up and pull-down modules are connected to the first bus, or the pull-up and pull-down modules are integrated in the receiver and connected to the receive port.

6. The rechargeable battery monitoring system according to claim 4, wherein the rechargeable battery monitoring system further comprises an isolation unit; and the transmit port is connected to the first bus through the isolation unit.

7. The rechargeable battery monitoring system according to claim 6, wherein the isolation unit is one of a capacitive isolation unit, an inductive isolation unit, or an optical isolation unit.

8. The rechargeable battery monitoring system according to claim 1, wherein the BMU comprises a communication converter, a microcontroller unit, MCU, and a second bus; and the communication converter is connected to the first bus, and is connected to the MCU through the second bus.

9. The rechargeable battery monitoring system according to claim 8, wherein the first bus (12) is a UART bus, and the second bus is one of an SPI bus, a UART bus, a CAN bus, or an I$^2$C bus.

10. The rechargeable battery monitoring system according to claim 1, wherein among the several battery modules, a CMC corresponding to one of a highest-potential cell module or a lowest-potential cell module is a head module, and a CMC corresponding to the other of the highest-potential cell module or the lowest-potential cell module is an end module; and the end module; and the end module itself completes a daisy chain loop.

11. The rechargeable battery monitoring system according to claim 1, wherein a signal is transmitted between the CMC and the BMU in a differential manner.

12. A battery pack, comprising a rechargeable battery and the rechargeable battery monitoring system according to claim 1.

13. An electric vehicle, comprising the battery pack according to claim 12.

* * * * *